US010763446B2

(12) United States Patent
Lin et al.

(10) Patent No.: US 10,763,446 B2
(45) Date of Patent: Sep. 1, 2020

(54) ORGANIC THIN FILM TRANSISTOR

(71) Applicant: E Ink Holdings Inc., Hsinchu (TW)

(72) Inventors: Kuan-Yi Lin, Hsinchu (TW);
Wen-Chung Tang, Hsinchu (TW);
Po-Wei Chen, Hsinchu (TW); Yu-Lin Hsu, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 15/973,518

(22) Filed: May 7, 2018

(65) Prior Publication Data
US 2018/0331310 A1    Nov. 15, 2018

(30) Foreign Application Priority Data

May 10, 2017  (CN) .......................... 2017 1 0324191

(51) Int. Cl.
*H01L 51/05* (2006.01)
*H01L 51/10* (2006.01)
*H01L 51/00* (2006.01)

(52) U.S. Cl.
CPC ...... *H01L 51/0558* (2013.01); *H01L 51/0541* (2013.01); *H01L 51/105* (2013.01); *H01L 51/107* (2013.01); *H01L 51/0003* (2013.01); *H01L 51/0023* (2013.01); *H01L 51/052* (2013.01); *H01L 51/0529* (2013.01)

(58) Field of Classification Search
None
See application file for complete search history.

(56) References Cited

U.S. PATENT DOCUMENTS

| 7,897,482 | B2 | 3/2011 | Toriumi |
| 8,203,139 | B2 | 6/2012 | Saito et al. |
| 8,431,448 | B2 | 4/2013 | Obata et al. |
| 8,487,342 | B2 | 7/2013 | Toriumi |
| 2006/0102896 | A1 | 5/2006 | Suh et al. |
| 2007/0152210 | A1* | 7/2007 | Han .................... H01L 51/0512 257/40 |

(Continued)

FOREIGN PATENT DOCUMENTS

CN    1992370 B    6/2012

OTHER PUBLICATIONS

Corresponding Taiwan office action dated Sep. 19, 2018.

*Primary Examiner* — Zandra V Smith
*Assistant Examiner* — Lawrence C Tynes, Jr.
(74) *Attorney, Agent, or Firm* — CKC & Partners Co., LLC

(57) ABSTRACT

An organic thin film transistor includes a substrate, a source/drain layer that is located on the substrate and has a source region and a drain region, a first buffer layer that is located between the source region and the drain region, a semiconductor layer that is located on the source/drain layer and the first buffer layer, a gate insulating layer, and a gate electrode. The first buffer layer covers at least one portion of the source region and at least one portion of the drain region. The first buffer layer is located among the semiconductor layer, the source region, the drain region, and the substrate. The gate insulating layer covers the source/drain layer and the semiconductor layer. The gate electrode is located on the gate insulating layer, and a portion of the gate insulating layer is located between the gate electrode and the semiconductor layer.

14 Claims, 5 Drawing Sheets

(56) References Cited

U.S. PATENT DOCUMENTS

| | | | |
|---|---|---|---|
| 2007/0152211 A1* | 7/2007 | Han | H01L 51/105 257/40 |
| 2007/0158648 A1* | 7/2007 | Suh | H01L 51/0545 257/40 |
| 2007/0164321 A1 | 7/2007 | Sheppard et al. | |
| 2008/0197346 A1* | 8/2008 | Moon | C07F 1/005 257/40 |
| 2010/0283041 A1* | 11/2010 | Nakamura | B82Y 10/00 257/40 |
| 2016/0079385 A1* | 3/2016 | Ellinger | H01L 29/42384 257/66 |
| 2016/0172590 A1 | 6/2016 | Xie et al. | |
| 2018/0120612 A1* | 5/2018 | Lius | G02F 1/13624 |

\* cited by examiner

ORGANIC THIN FILM TRANSISTOR

RELATED APPLICATIONS

This application claims priority to China Application Serial Number 201710324191.0, filed May 10, 2017, which is herein incorporated by reference.

BACKGROUND

Field of Invention

The present invention relates to an organic thin film transistor.

Description of Related Art

Generally speaking, a source/drain layer of an organic thin film transistor is made of gold, silver, or another material that can react with a self-assembly monolayer (SAM), in which the self-assembly monolayer is a semiconductor layer of the organic thin film transistor.

In manufacturing an organic thin film transistor, the source/drain layer is patterned to form a source region and a drain region that are spaced apart at a gap, and then a semiconductor layer is formed on the source region and the drain region adjacent to the gap, and is formed in the gap between the source region and the drain region by coating. However, due to limitations of materials of the source region and the drain region, after the source/drain layer is patterned, a taper undercut structure is formed on the source region and the drain region that are adjacent to the gap. As a result, the semiconductor layer in the gap and adjacent to the taper undercut structure has a greater thickness, and the semiconductor layer with the greater thickness will affect molecular arrangements. In other words, the semiconductor layer with non-uniform thickness will cause adverse effects on stability of electrical properties of the organic thin film transistor.

SUMMARY

An aspect of the present invention is to provide an organic thin film transistor.

According to an embodiment of the present invention, an organic thin film transistor includes a substrate, a source/drain layer, a first buffer layer, a semiconductor layer, a gate insulating layer, and a gate electrode. The source/drain layer is located on the substrate and has a source region and a drain region. The first buffer layer is located between the source region and the drain region, and covers at least one portion of the source region and at least one portion of the drain region. The semiconductor layer is located on the source/drain layer and the first buffer layer. The first buffer layer is located among the semiconductor layer, the source region, the drain region, and the substrate. The gate insulating layer covers the source/drain layer and the semiconductor layer. The gate electrode is located on the gate insulating layer, and a portion of the gate insulating layer is located between the gate electrode and the semiconductor layer.

In one embodiment of the present invention, the organic thin film transistor further includes a protective layer. The protective layer is disposed along the semiconductor layer. The semiconductor layer is located between the protective layer and the source/drain layer, and is located between the protective layer and the first buffer layer.

In one embodiment of the present invention, the organic thin film transistor further includes a photoresist layer. The photoresist layer is located on the protective layer and is located between the gate insulating layer and the protective layer.

In one embodiment of the present invention, the organic thin film transistor further includes a barrier layer. The barrier layer is located on the substrate, and the first buffer layer is located among the semiconductor layer, the source region, the drain region, and the barrier layer.

In one embodiment of the present invention, the organic thin film transistor further includes a second buffer layer. The second buffer layer is located on the barrier layer, and the first buffer layer is located among the semiconductor layer, the source region, the drain region, and the second buffer layer.

In one embodiment of the present invention, the source region has a first surface and a second surface opposite the first surface, and has a sidewall adjacent to the first surface and the second surface, and the first surface faces the substrate, and an obtuse angle is formed between the sidewall and the first surface.

In one embodiment of the present invention, the first buffer layer has a central portion and an extending portion, and the central portion is located between the source region and the drain region, and the extending portion is located on the second surface of the source region.

In one embodiment of the present invention, at least one portion of the source region is located between the extending portion and the central portion.

In one embodiment of the present invention, the first buffer layer is in contact with the sidewall of the source region.

In one embodiment of the present invention, the drain region has a first surface and a second surface opposite the first surface, and has a sidewall adjacent to the first surface and the second surface, and the first surface faces the substrate, and an obtuse angle is formed between the sidewall and the first surface.

In the aforementioned embodiments of the present invention, because the first buffer layer is located between the source region and the drain region, and covers at least one portion of the source region and at least one portion of the drain region, the semiconductor layer may be located on the source/drain layer and the first buffer layer. In such a configuration, the first buffer layer may be utilized to fill a space between the source region and the drain region, thereby preventing the semiconductor layer from being formed on taper undercut structures of the source region and the drain region, thus preventing the semiconductor layer from having a greater thickness. As a result, the semiconductor layer has uniform thickness, and does not affect molecular arrangements, and thus stability of electrical properties of the organic thin film transistor can be improved.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
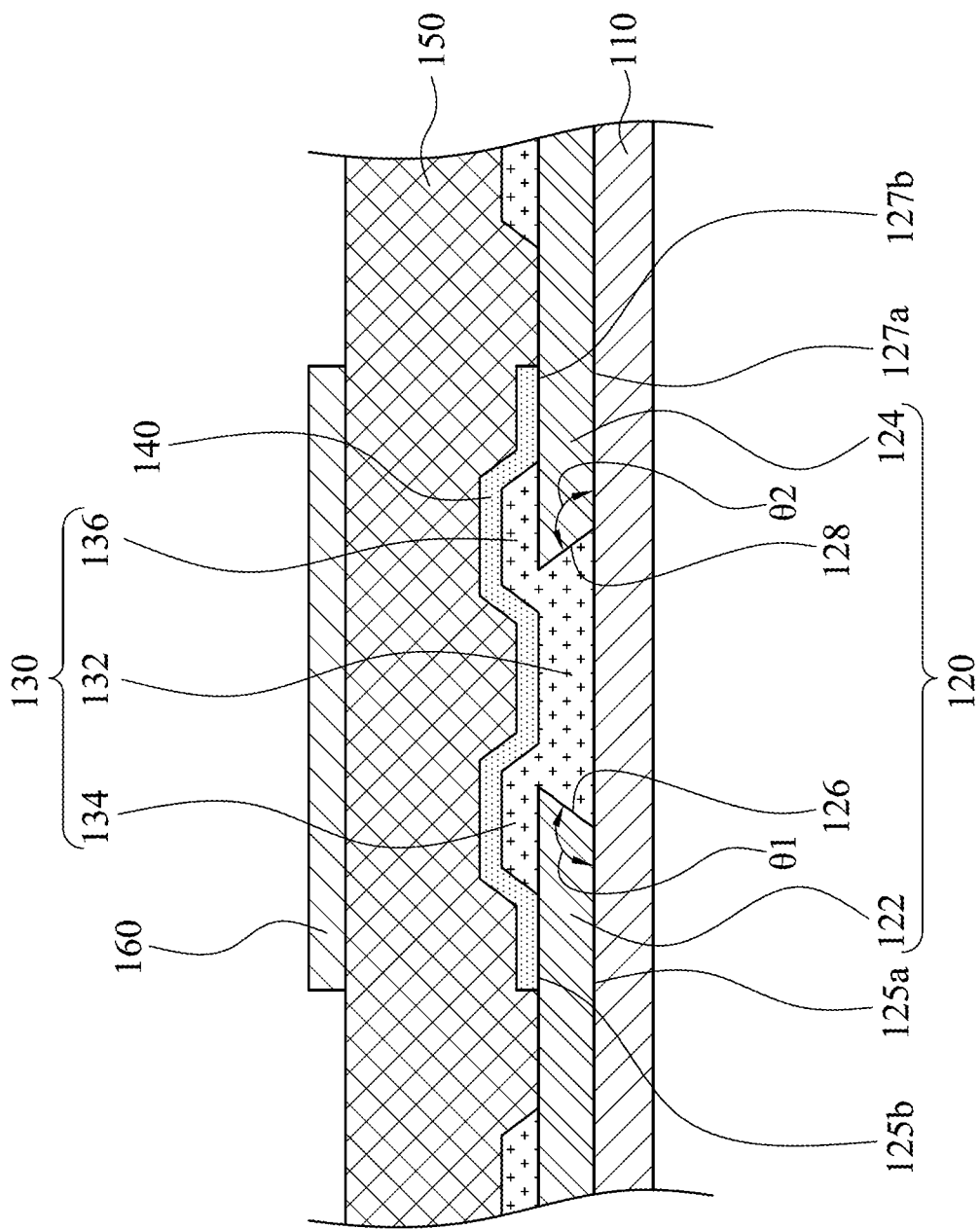
FIG. 1 is a cross-sectional view of an organic thin film transistor according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a cross-sectional view of an organic thin film transistor 100 according to one embodiment of the present invention. As shown in FIG. 1, the organic thin film transistor 100 includes a substrate 110, a source/drain layer 120, a first buffer layer 130, a semiconductor layer 140, a gate insulating layer 150, and a gate electrode 160. The source/drain layer 120 is located on a surface of the substrate 110. The source/drain layer 120 has a source region 122 and a drain region 124 that are spaced apart from each other at a gap. The first buffer layer 130 fills the gap. In other words, the first buffer layer 130 is located between the source region 122 and the drain region 124. Moreover, the first buffer layer 130 further extends onto the source region 122 and the drain region 124, thereby covering at least one portion of the source region 122 and at least one portion of the drain region 124. The aforementioned first buffer layer 130 may be made of material including high-molecular polymer.

The semiconductor layer 140 is located on the source/drain layer 120 and the first buffer layer 130, and thus the first buffer layer 130 is located among the semiconductor layer 140, the source region 122, the drain region 124, and the substrate 110. Stated differently, the first buffer layer 130 is surrounded by the semiconductor layer 140, the source region 122, the drain region 124, and the substrate 110. The gate insulating layer 150 covers the source/drain layer 120 and the semiconductor layer 140. The gate electrode 160 is located on the gate insulating layer 150, and a portion of the gate insulating layer 150 is located between the gate electrode 160 and the semiconductor layer 140.

In this embodiment, the source/drain layer 120 may be made of a material including silver or gold. When the source/drain layer 120 is patterned (e.g., by an etching process), taper undercut structures are formed on the source region 122 and the drain region 124, thus forming obtuse angles θ1 and θ2. In addition, the gate insulating layer 150 may be made of an organic material to act as an organic gate insulator (OGI).

The semiconductor layer 140 may be formed by spin coating or slit coating, but the present invention is not limited in this regard. Since the first buffer layer 130 is located between the source region 122 and the drain region 124, and covers at least one portion of the source region 122 and at least one portion of the drain region 124, the semiconductor layer 140 may be located on the source/drain layer 120 and the first buffer layer 130. In such a configuration, the first buffer layer 130 may be utilized to fill a space between the source region 122 and the drain region 124, thereby preventing the semiconductor layer 140 from being formed on areas of taper undercut structures of the source region 122 and the drain region 124, thus preventing the semiconductor layer 140 from having a greater thickness that causes the entire semiconductor layer 140 to have non-uniform thickness and further affects stability of electrical properties. Due to the first buffer layer 130 under the semiconductor layer 140, the semiconductor layer 140 may have uniform thickness in the formation of the semiconductor layer 140, and thus stability of electrical properties of the organic thin film transistor 100 can be improved.

In this embodiments, the source region 122 has a first surface 125*a* and a second surface 125*b* opposite the first surface 125*a*, and has a sidewall 126 adjacent to the first surface 125*a* and the second surface 125*b*. The drain region 124 has a first surface 127*a* and a second surface 127*b* opposite the first surface 127*a*, and has a sidewall 128 adjacent to the first surface 127*a* and the second surface 127*b*. The first surface 125*a* of the source region 122 and the first surface 127*a* of the drain region 124 face the substrate 110, and the second surface 125*b* of the source region 122 and the second surface 127*b* of the drain region 124 face away from the substrate 110. The obtuse angle θ1 is formed between the sidewall 126 and the first surface 125*a* of the source region 122, and the obtuse angle θ2 is formed between the sidewall 128 and the first surface 127*a* of the drain region 124.

Furthermore, the first buffer layer 130 has a central portion 132 and extending portions 134 and 136, and the central portion 132 is located between the source region 122 and the drain region 124. The extending portion 134 is located on the second surface 125*b* of the source region 122, and the extending portion 136 is located on the second surface 127*b* of the drain region 124. In addition, the first buffer layer 130 is in contact with the sidewall 126 and the second surface 125*b* of the source region 122, and is in contact with the sidewall 128 and the second surface 127*b* of the drain region 124. As a result, at least one portion of the source region 122 is located between the extending portion 134 and the central portion 132, and at least one portion of the drain region 124 is located between the extending portion 136 and the central portion 132. Such a configuration can ensure that the semiconductor layer 140 near the sidewalls 126 and 128 (the taper undercut structures) is separated from the sidewalls 126 and 128 by the first buffer layer 130, and is supported by the first buffer layer 130, thereby preventing the semiconductor layer 140 from falling into a space between the source region 122 and the drain region 124 and having non-uniform thickness.

It is to be noted that the connection relationships, materials, and advantages of the elements described above will not be repeated hereinafter, and other types of organic thin film transistors will be described.

Figure 2:
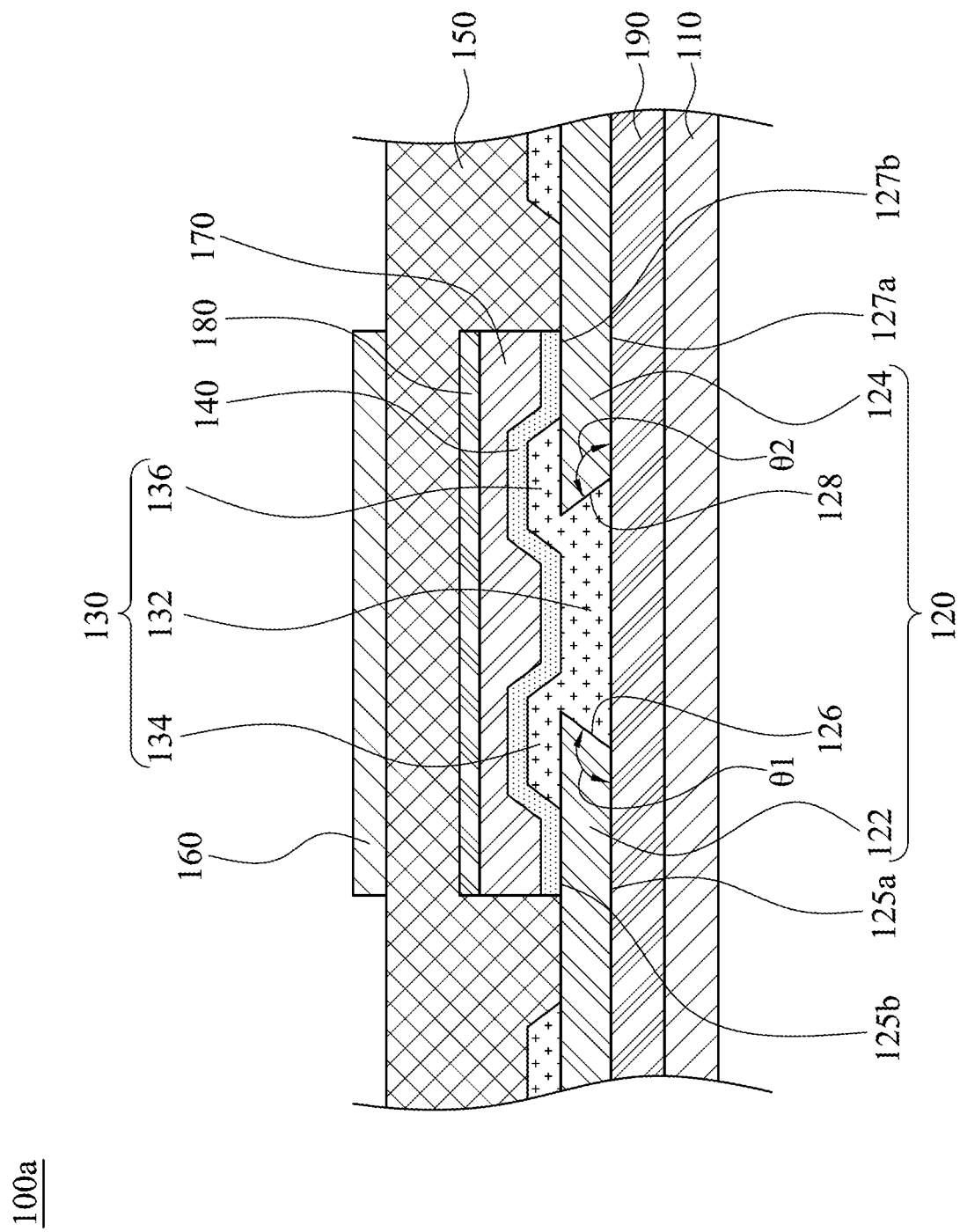
FIG. 2 is a cross-sectional view of an organic thin film transistor according to one embodiment of the present invention.

FIG. 2 is a cross-sectional view of an organic thin film transistor 100*a* according to one embodiment of the present invention. The organic thin film transistor 100*a* includes the substrate 110, the source/drain layer 120, the first buffer layer 130, the semiconductor layer 140, the gate insulating layer 150, and the gate electrode 160. The difference between this embodiment and the embodiment shown in FIG. 1 is that the organic thin film transistor 100*a* further includes a protective layer 170, a photoresist layer 180, and a barrier layer 190. The protective layer 170 is disposed along a surface of the semiconductor layer 140. The semiconductor layer 140 is located between the protective layer 170 and the source/drain layer 120, and is located between the protective layer 170 and the first buffer layer 130.

Moreover, the photoresist layer 180 is located on the protective layer 170, and is located between the gate insulating layer 150 and the protective layer 170. The barrier layer 190 is located on the substrate 110 and is disposed along a surface of the substrate 110, and thus the first buffer layer 130 of the organic thin film transistor 100a is located among the semiconductor layer 140, the source region 122, the drain region 124, and the barrier layer 190. In other words, the first buffer layer 130 of the organic thin film transistor 100a is surrounded by the semiconductor layer 140, the source region 122, the drain region 124, and the barrier layer 190.

In this embodiment, the protective layer 170 may be made of an organic material to act as an organic protective layer (OPL). The photoresist layer 180 may be made of an organic material to act as an organic photoresist (OPR). The barrier layer 190 may be made of a material including silicon nitride (SiNx) or silicon oxide (SiOx), but the present invention is not limited in this regard.

Figure 3:
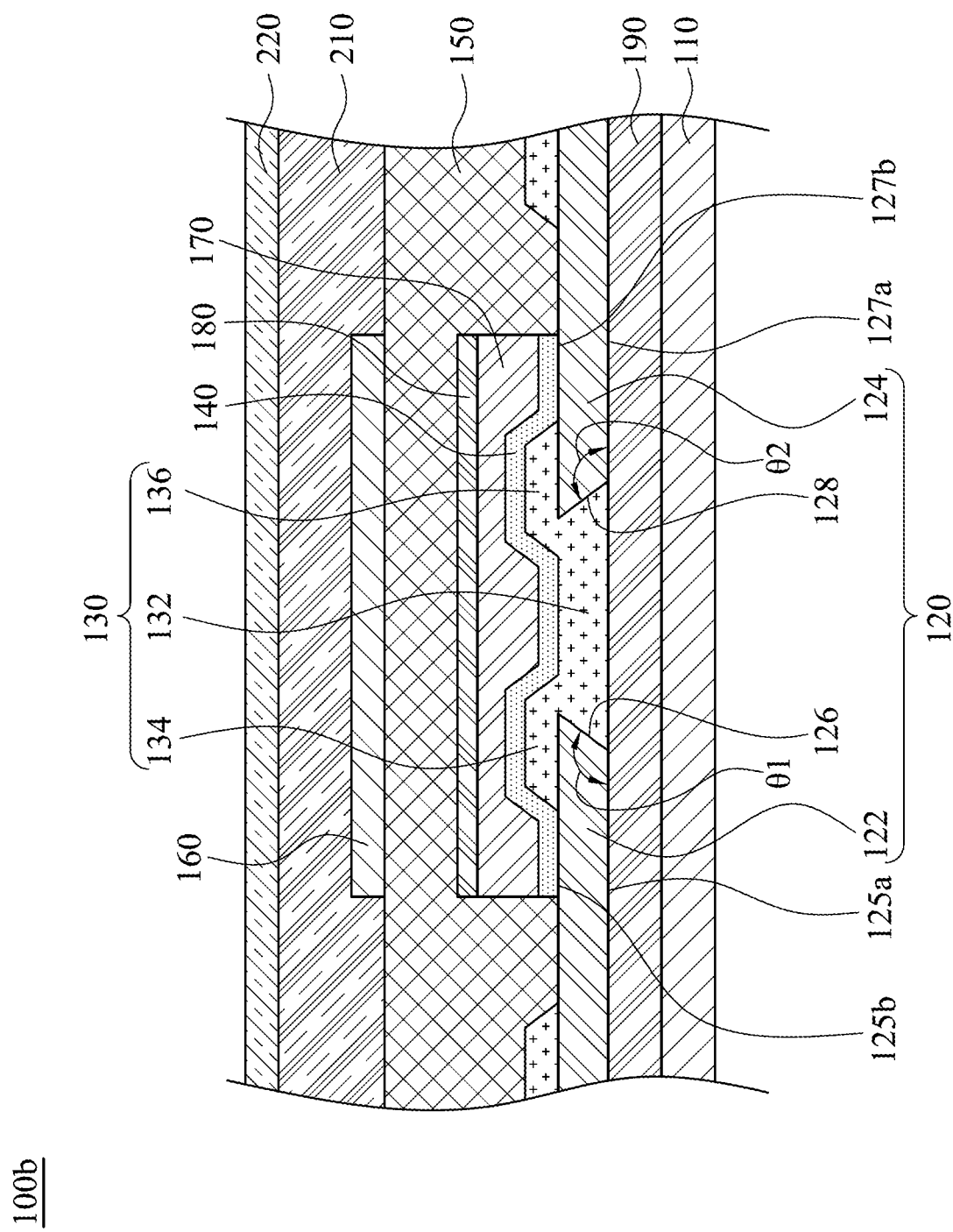
FIG. 3 is a cross-sectional view of an organic thin film transistor according to one embodiment of the present invention.

FIG. 3 is a cross-sectional view of an organic thin film transistor 100b according to one embodiment of the present invention. The organic thin film transistor 100b includes the substrate 110, the source/drain layer 120, the first buffer layer 130, the semiconductor layer 140, the gate insulating layer 150, the gate electrode 160, the protective layer 170, the photoresist layer 180, and the barrier layer 190. The difference between this embodiment and the embodiment shown in FIG. 2 is that the organic thin film transistor 100b further includes a passivation layer 210 and a pixel electrode 220. The passivation layer 210 covers the gate electrode 160 and the gate insulating layer 150, and the pixel electrode 220 is located on the passivation layer 210. In this embodiment, the passivation layer 210 may be made of an organic material to act as an organic passivation (OPV) layer.

Figure 4:
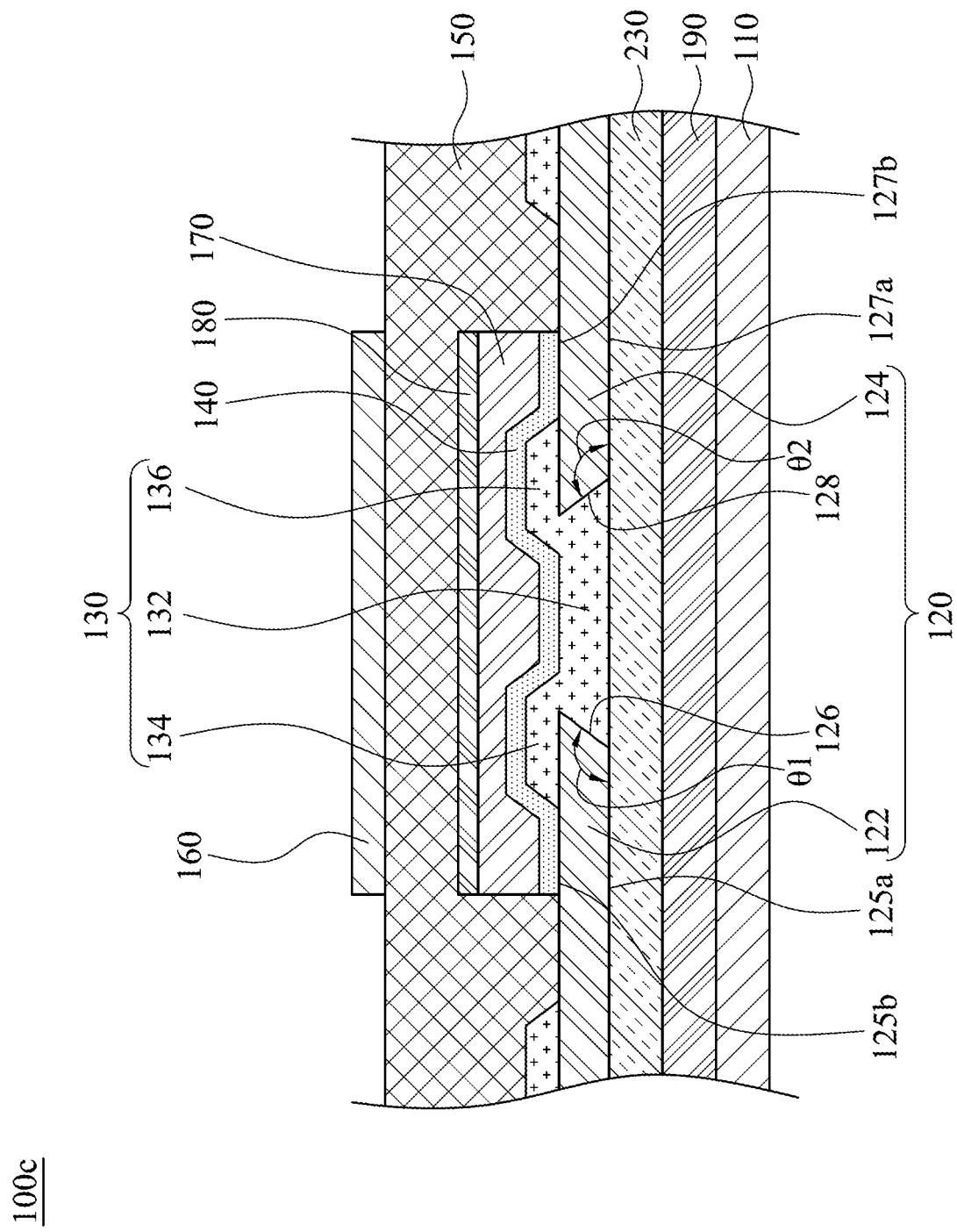
FIG. 4 is a cross-sectional view of an organic thin film transistor according to one embodiment of the present invention.

FIG. 4 is a cross-sectional view of an organic thin film transistor 100c according to one embodiment of the present invention. The organic thin film transistor 100c includes the substrate 110, the source/drain layer 120, the first buffer layer 130, the semiconductor layer 140, the gate insulating layer 150, the gate electrode 160, the protective layer 170, the photoresist layer 180, and the barrier layer 190. The difference between this embodiment and the embodiment shown in FIG. 2 is that the organic thin film transistor 100c further includes a second buffer layer 230. The second buffer layer 230 is located on the barrier layer 190, and thus the first buffer layer 130 is located among the semiconductor layer 140, the source region 122, the drain region 124, and the second buffer layer 230. In other words, the first buffer layer 130 is surrounded by the semiconductor layer 140, the source region 122, the drain region 124, and the second buffer layer 230.

Figure 5:
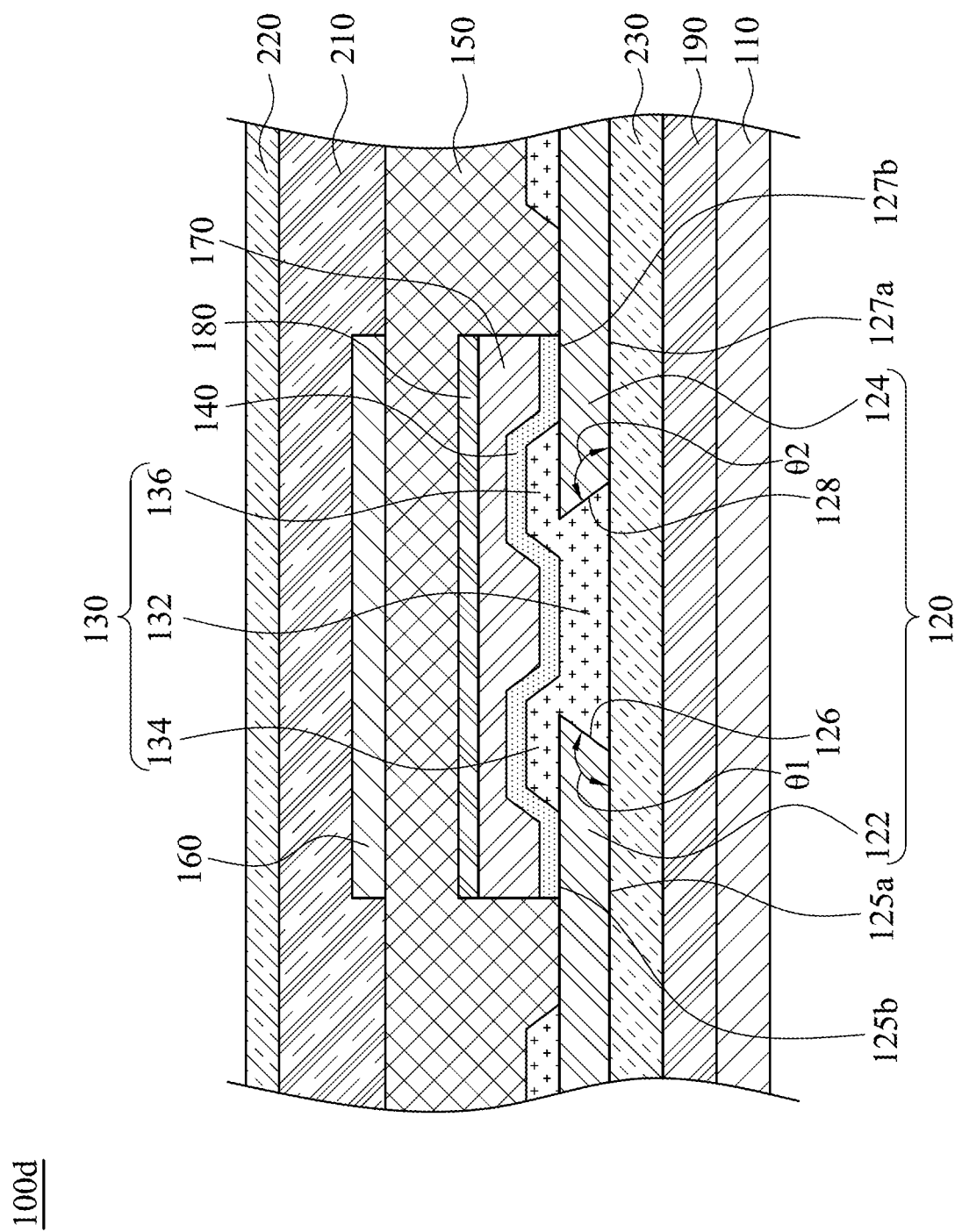
FIG. 5 is a cross-sectional view of an organic thin film transistor according to one embodiment of the present invention.

FIG. 5 is a cross-sectional view of an organic thin film transistor 100d according to one embodiment of the present invention. The organic thin film transistor 100d includes the substrate 110, the source/drain layer 120, the first buffer layer 130, the semiconductor layer 140, the gate insulating layer 150, the gate electrode 160, the protective layer 170, the photoresist layer 180, the barrier layer 190, and the second buffer layer 230. The difference between this embodiment and the embodiment shown in FIG. 4 is that the organic thin film transistor 100d further includes the passivation layer 210 and the pixel electrode 220. The passivation layer 210 covers the gate electrode 160 and the gate insulating layer 150, and the pixel electrode 220 is located on the passivation layer 210.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims.

What is claimed is:

1. An organic thin film transistor, comprising:
    a substrate;
    a source/drain layer located on the substrate, and having a source region and a drain region;
    a first buffer layer located between the source region and the drain region, and covering at least one portion of the source region and at least one portion of the drain region, wherein a top surface of the first buffer layer is not lower than a top surface of the source region and a top surface of the drain region;
    a semiconductor layer located on the source/drain layer and the first buffer layer, wherein the first buffer layer is located among the semiconductor layer, the source region, the drain region, and the substrate;
    a protective layer disposed along the semiconductor layer, wherein the semiconductor layer is located between the protective layer and the source/drain layer, and is located between the protective layer and the first buffer layer;
    a gate insulating layer covering the source/drain layer and the semiconductor layer;
    a photoresist layer located on the protective layer and between the gate insulating layer and the protective layer; and
    a gate electrode located on the gate insulating layer, wherein a portion of the gate insulating layer is located between the gate electrode and the semiconductor layer.

2. The organic thin film transistor of claim 1, further comprising:
    a barrier layer located on the substrate, wherein the first buffer layer is located among the semiconductor layer, the source region, the drain region, and the barrier layer.

3. The organic thin film transistor of claim 2, further comprising:
    a second buffer layer located on the barrier layer, wherein the first buffer layer is located among the semiconductor layer, the source region, the drain region, and the second buffer layer.

4. The organic thin film transistor of claim 1, wherein the source region has a bottom surface and the top surface opposite the bottom surface, and has a sidewall adjacent to the bottom surface and the top surface, and the bottom surface faces the substrate, and an obtuse angle is formed between the sidewall and the bottom surface.

5. The organic thin film transistor of claim 4, wherein the first buffer layer has a central portion and an extending portion, and the central portion is located between the source region and the drain region, and the extending portion is located on the top surface of the source region.

6. The organic thin film transistor of claim 5, wherein at least one portion of the source region is located between the extending portion and the central portion.

7. The organic thin film transistor of claim 4, wherein the first buffer layer is in contact with the sidewall of the source region.

8. The organic thin film transistor of claim 1, wherein the drain region has a bottom surface and a top surface opposite the bottom surface, and has a sidewall adjacent to the bottom surface and the top surface, and the bottom surface faces the substrate, and an obtuse angle is formed between the sidewall and the bottom surface.

9. An organic thin film transistor, comprising:
- a substrate;
- a source/drain layer located on the substrate, and having a source region and a drain region;
- a first buffer layer located between the source region and the drain region, and covering at least one portion of the source region and at least one portion of the drain region, wherein a top surface of the first buffer layer is not lower than a top surface of the source region and a top surface of the drain region;
- a semiconductor layer located on the source/drain layer and the first buffer layer, wherein the first buffer layer is located among the semiconductor layer, the source region, the drain region, and the substrate;
- a barrier layer located on the substrate, wherein the first buffer layer is located among the semiconductor layer, the source region, the drain region, and the barrier layer;
- a second buffer layer located on the barrier layer, wherein the first buffer layer is located among the semiconductor layer, the source region, the drain region, and the second buffer layer;
- a gate insulating layer covering the source/drain layer and the semiconductor layer; and
- a gate electrode located on the gate insulating layer, wherein a portion of the gate insulating layer is located between the gate electrode and the semiconductor layer.

10. The organic thin film transistor of claim 9, wherein the source region has a bottom surface and the top surface opposite the bottom surface, and has a sidewall adjacent to the bottom surface and the top surface, and the bottom surface faces the substrate, and an obtuse angle is formed between the sidewall and the bottom surface.

11. The organic thin film transistor of claim 10, wherein the first buffer layer has a central portion and an extending portion, and the central portion is located between the source region and the drain region, and the extending portion is located on the top surface of the source region.

12. The organic thin film transistor of claim 11, wherein at least one portion of the source region is located between the extending portion and the central portion.

13. The organic thin film transistor of claim 10, wherein the first buffer layer is in contact with the sidewall of the source region.

14. The organic thin film transistor of claim 9, wherein the drain region has a bottom surface and a top surface opposite the bottom surface, and has a sidewall adjacent to the bottom surface and the top surface, and the bottom surface faces the substrate, and an obtuse angle is formed between the sidewall and the bottom surface.

\* \* \* \* \*